(12) United States Patent
Craninckx (10) Patent No.: US 7,920,832 B2
(45) Date of Patent: Apr. 5, 2011

(54) ELECTRICAL DEVICE COMPRISING ANALOG FREQUENCY CONVERSION CIRCUITRY AND METHOD FOR DERIVING CHARACTERISTICS THEREOF

(75) Inventor: Jan Craninckx, Boutersem (BE)

(73) Assignee: IMEC, Leuven (BE)

( * ) Notice: Subject to any disclaimer, the term of this patent is extended or adjusted under 35 U.S.C. 154(b) by 659 days.

(21) Appl. No.: 11/979,084

(22) Filed: Oct. 30, 2007

(65) Prior Publication Data
US 2009/0004975 A1    Jan. 1, 2009

Related U.S. Application Data

(63) Continuation of application No. 10/885,049, filed on Jul. 6, 2004, now Pat. No. 7,336,931.

(30) Foreign Application Priority Data

Jul. 7, 2003 (EP) .................................... 03447180

(51) Int. Cl.
*H04B 1/40* (2006.01)
(52) U.S. Cl. ............ 455/74; 455/88; 455/78; 455/553.1
(58) Field of Classification Search .................... 455/74, 455/88, 78, 553.1, 552.1, 86, 83, 87, 114.2, 455/147, 231.1, 187.1
See application file for complete search history.

(56) References Cited

U.S. PATENT DOCUMENTS

| 5,859,878 | A  | * | 1/1999  | Phillips et al. ................. 375/316 |
| 5,918,167 | A  |   | 6/1999  | Tiller et al. |
| 6,804,497 | B2 | * | 10/2004 | Kerth et al. ...................... 455/88 |
| 6,970,717 | B2 | * | 11/2005 | Behrens et al. ............. 455/553.1 |

FOREIGN PATENT DOCUMENTS

| EP | 0477720 A | 4/1992 |
| EP | 1172928 A | 1/2002 |
| WO | WO00059171 | 10/2000 |

OTHER PUBLICATIONS

European Search Report from European Application No. 04447165, dated Aug. 18, 2004.
M. Faulkner et al., "Automatic Adjustment of Quadrature Modulators", IEEE Electronic Letters, vol. 27, Issue 3, pp. 214-216.
D. Hilborn et al., "An Adaptive Direct Conversion Transmitter", IEEE Trans. On Vehicular Technology, vol. 43, Issue 2, pp. 223-233, May 1994.

* cited by examiner

*Primary Examiner* — John Lee
(74) *Attorney, Agent, or Firm* — McDonnell Boehnen Hulbert & Berghoff LLP (57) ABSTRACT

An electrical device comprises analog conversion circuitry having an input and an output. The electrical device is essentially provided for converting a first input signal within a first frequency range applied to the input to a first output signal within a second frequency range different from the first frequency range at the output. The electrical device further comprises a signal adding means for adding at least a portion of the first output signal as second input signal to the first input signal. The analog conversion circuitry is also capable of converting the second input signal, which is within the second frequency range, back to the first frequency range. Additionally, a characteristic deriving means is provided for deriving at least one characteristic of the electrical device from the frequency converted second input signal, which appears at the output of the analog conversion circuitry.

8 Claims, 12 Drawing Sheets

ELECTRICAL DEVICE COMPRISING ANALOG FREQUENCY CONVERSION CIRCUITRY AND METHOD FOR DERIVING CHARACTERISTICS THEREOF

PRIORITY

This application is a continuation of U.S. patent application Ser. No. 10/885,049, filed on Jul. 6, 2004. U.S. patent application Ser. No. 10/885,049 claims benefit, under 35 U.S.C. §119, of European Patent Application No. EP 03447180.5, which was filed on Jul. 7, 2003. The entire disclosures of U.S. patent application Ser. No. 10/885,049 and European Patent Application No. EP 03447180.5 are incorporated herein by reference.

FIELD

The present invention relates to an electrical device comprising analog conversion circuitry for converting signals from a first frequency range to a second frequency range, in particular an analog transmit and/or receiver device, such as for example a direct upconversion transmitter. The invention further relates to a method for deriving characteristics of such a device and precompensating an input signal of such a device.

BACKGROUND

The direct upconversion (or zero-IF, where IF is the acronym for intermediate frequency) transmitter is the transmitter architecture typically used in wireless transceivers. In such a transmitter, two mixers are driven by baseband (BB) and local oscillator (LO) signals, which are in quadrature. Ideally, combining the two signal paths as $BB_I \cdot LO_I - BB_Q \cdot LO_Q$ provides a single output frequency $\omega_{LO}+\omega_{BB}$. However, there are analog imperfections such as direct current (DC) offsets ($\delta_{BBi,q}$, $\delta_{LOi,q}$), LO-to-RF (where RF is the acronym for radio frequency) feedthrough ($\sigma_{LOi}$, $\sigma_{LOq}$), and quadrature amplitude ($\epsilon_{BB}$, $\epsilon_{LO}$) and phase ($\Delta\phi_{BB}$, $\Delta\phi_{LO}$) errors. These imperfections cause an output spectrum containing an image and a carrier signal. High-end telecom systems, such as a wireless local area network (WLAN), require suppression of these spurs. In order to determine the exact origin and contribution of the analog non-idealities to this output spectrum, the amplitude and phase of each spur must be known. In the prior art, this is done by downconverting the RF spectrum back to baseband with a substantially ideal receiver, i.e., an expensive device that has a substantially higher conversion accuracy than the transmitter, which is necessary since otherwise the measurement will be as erroneous as the errors that are to be determined. According, this method is not viable for automatic calibration.

Furthermore, up to now only techniques using the amplitude information are known. This amplitude information is obtained by placing a peak detector at the RF output [M. Faulkner, T. Mattsson, and W. Yates, "Automatic adjustment of quadrature modulators", *IEE Electronic Letters*, vol. 27, no. 3, pp. 214-215, January 1991] or by monitoring the power in an adjacent channel [D. Hilborn, S. Stapleton, and J. Cavers, "An adaptive direct conversion transmitter", *IEEE Trans. On Vehicular Technology*, vol. 43, no. 2, pp. 223-233, May 1994]. As no phase information on the spurs is available, a time-consuming recursive "trial-and-error" algorithm is needed in order to determine the optimal baseband corrections that result in the smallest error.

Thus, there is a need for a direct upconversion transmitter that can be calibrated without needing an expensive ideal receiver and for a method in which the device characteristics or non-idealities can be determined and compensated in a simpler way, avoiding a time-consuming recursive algorithm. Since the non-idealities of a direct upconversion transmitter largely originate from frequency conversion circuitry used and the frequency conversion circuitry is also used in other electrical devices, there is a more general need to provide any electrical device that comprises frequency conversion circuitry with a means for more simply and less expensively deriving the device characteristics, and to provide a simpler method for compensating the characteristics of such a device.

It is therefore an aim of the invention to provide an electrical device, a method for determining device characteristics, and a method for compensating the characteristics which fulfill the above mentioned needs.

SUMMARY

An electrical device comprises analog conversion circuitry having an input and an output. The electrical device is essentially provided for converting a first input signal within a first frequency range applied to the input to a first output signal within a second frequency range different from the first frequency range at the output. The electrical device further comprises a signal adding means for adding at least a portion of the first output signal as second input signal to the first input signal. This means that at least a portion of the output of the analog conversion circuitry, i.e., a portion of the signal within the second frequency range, is supplied back to the input of the analog conversion circuitry. The analog conversion circuitry is also capable of converting the second input signal, which is within the second frequency range, back to the first frequency range. Additionally, a characteristic deriving means is provided for deriving at least one characteristic of the electrical device from the frequency converted second input signal, which appears at the output of the analog conversion circuitry.

By supplying a portion of the output signal back to the input of the analog conversion circuitry, a signal portion is achieved at the output of the analog conversion circuitry, namely the frequency converted second input signal, which has been converted from the first frequency range to the second frequency range and back to the first frequency range with the same electrical device. As a result, the signal portion is twice subjected to the same non-idealities. From a comparison with the initial input signal, i.e., a comparison of the frequency converted second input signal with the first input signal, the double influence of these non-idealities on the signal during conversion can be determined and one or more device characteristics can be derived.

The output signal of the analog conversion circuitry, or at least a portion thereof, is converted back to the initial frequency range by re-using the same electrical device, avoiding the introduction of non-idealities from a second conversion device. As a result, the need for providing an expensive conversion device, which is more ideal or more accurate than the analog conversion circuitry, is avoided. Furthermore, however ideal or accurate such a second conversion device may be, it may still further deteriorate the signal. Thus, by converting the output signal back with the same electrical device such deterioration is avoided, so that the device characteristics can be determined more accurately.

The signal adding means for adding at least a portion of the output signal as a second input signal to the first input signal is preferably formed by an electrical connection from the output towards the input of the analog conversion circuitry. This electrical connection may comprise one or more circuit blocks. For example, the one or more circuit blocks may include one or more filters for eliminating signals outside the second frequency range from the output signal and/or a phase shifter for invoking one of a plurality of predetermined phase shifts to the second input signal before being added to the first input signal, or other circuit blocks.

Analogously, a method for determining device characteristics comprises: (a) supplying the first input signal to the electrical device, (b) adding at least a portion of the output signal as a second input signal to the first input signal, and (c) deriving at least one characteristic of the electrical device from the frequency converted second input signal. The method further comprises precompensating the input signal on the basis of the determined device characteristics. Precompensation is preferably performed in the digital domain.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

The invention is generally applicable to any electrical device having analog conversion circuitry which is essentially provided for performing a frequency conversion on a first input signal within a first frequency range to obtain an output signal within a second frequency range different from the first frequency range. Two such electrical devices are shown in FIGS. 1 and 2.

Figure 1:
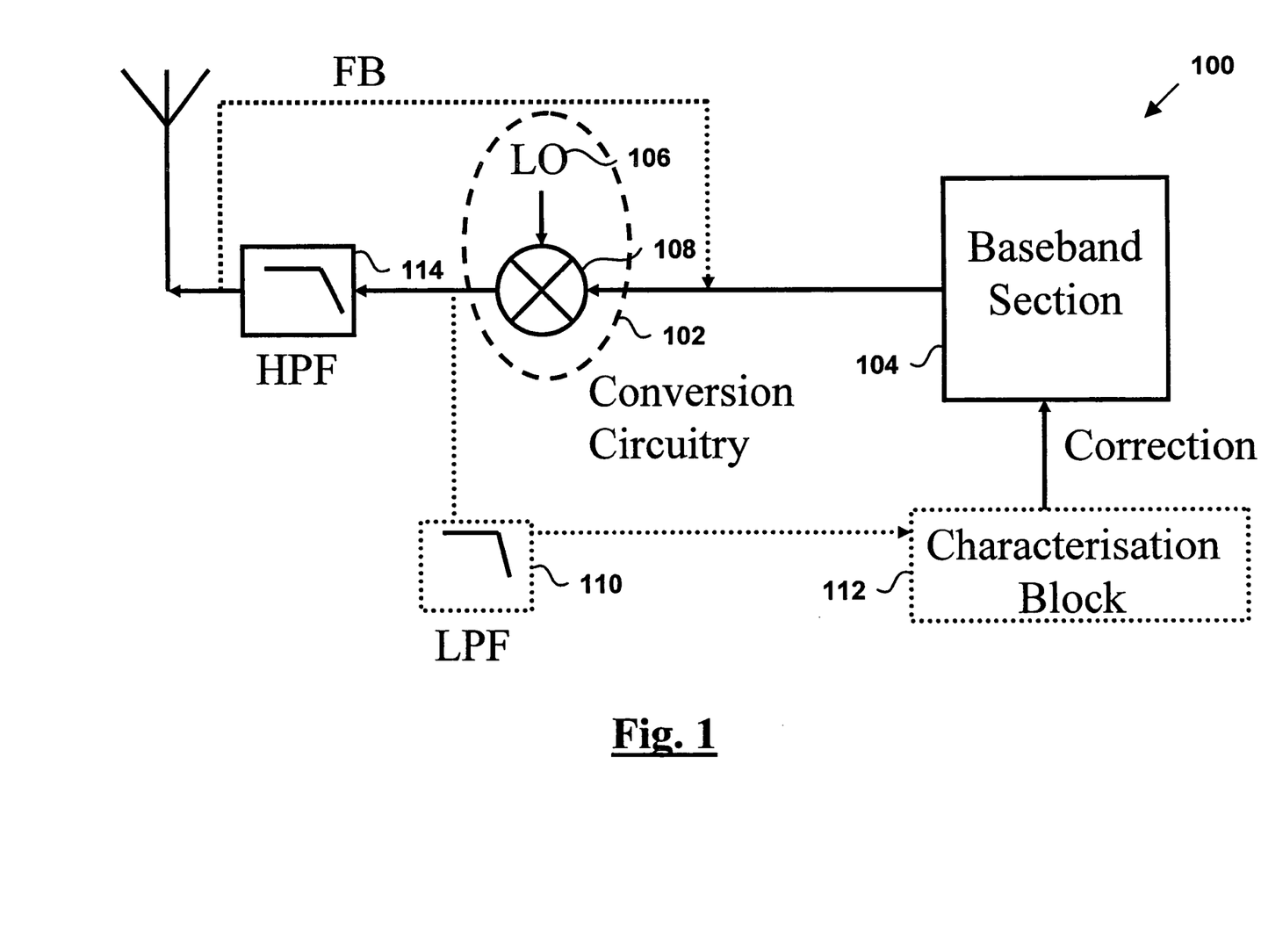
FIG. 1 shows a schematic representation of a transmit device comprising frequency conversion circuitry according to the invention.
Figure 2:
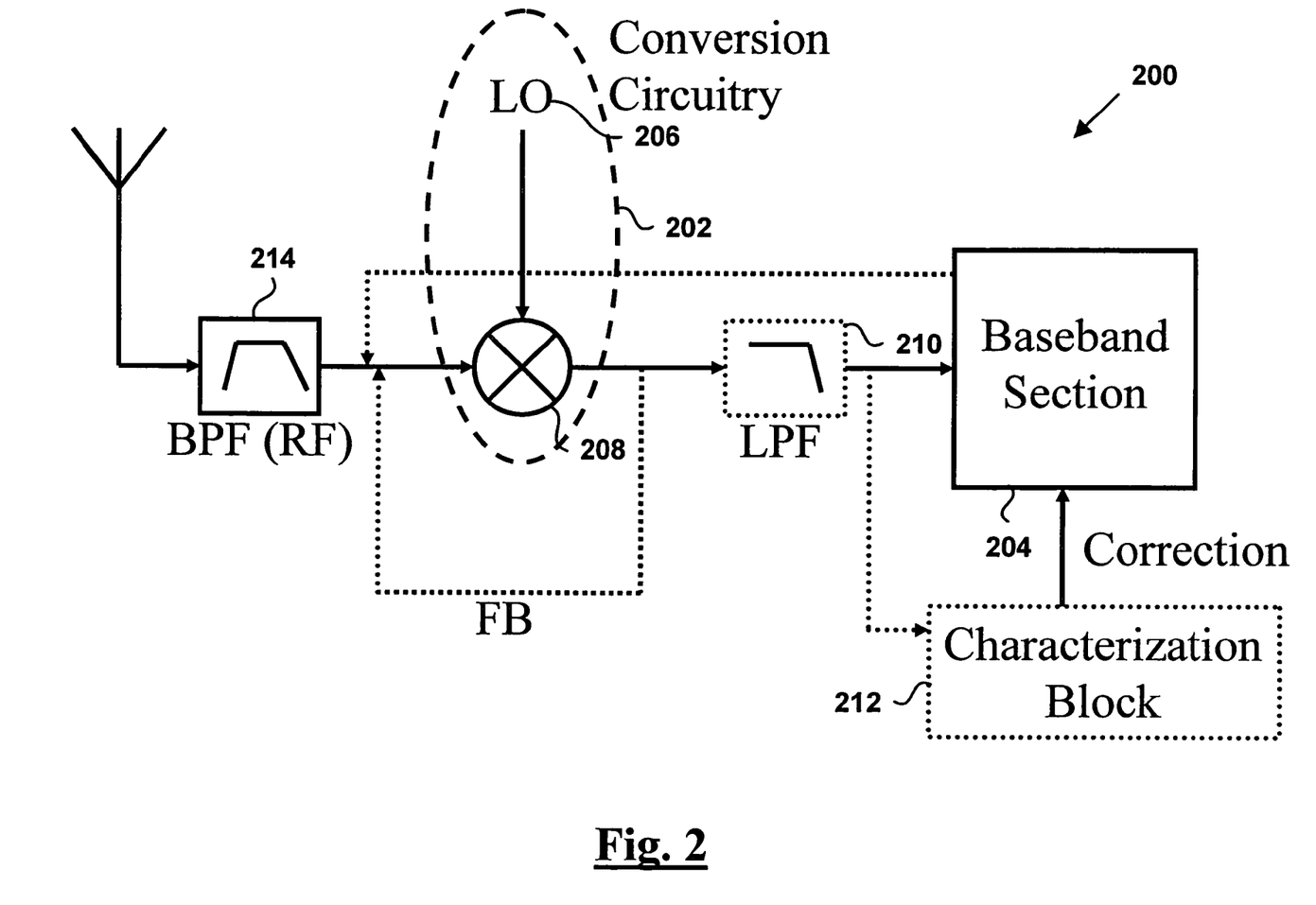
FIG. 2 shows a schematic representation of a receiver device comprising frequency conversion-circuitry according to the invention.

The device of FIG. 1 is an analog transmit device 100, which has analog conversion circuitry 102 for converting a baseband input signal to an RF output signal. The additional components of the device of FIG. 1 with respect to a known analog transmit device 100 are shown in dotted lines. The baseband input signal is supplied to the analog conversion circuitry 102 from a baseband section 104. The output signal of the analog conversion circuitry 102 is supplied to an RF section for transmittal.

The analog conversion circuitry 102 may comprise one or more conversion steps, each formed by a local oscillator (LO) 106 and a mixer 108. At least a portion of the output signal of the analog conversion circuitry 102 is added onto the baseband input signal by means of signal adding means, which is formed by an electrical connection feedback (FB) in FIG. 1, but other means may also be provided for this purpose. This has the effect that an RF second input signal is supplied to the input of the analog conversion circuitry, which is downconverted to a baseband portion in the output signal. This baseband portion is the result of an upconversion and a downconversion by the same analog conversion circuitry 102, so by measuring the baseband portion and comparing it with the baseband input signal, characteristics of the analog conversion circuitry 102 can be determined.

The baseband portion is conveniently extracted from the output signal by means of a low pass filter (LPF) 110 or alternative means and supplied to a characterization block 112, which is provided for deriving the desired device characteristics and supplying signal correction data to the baseband section 104. The output signal, which is supplied to the RF section is also filtered, namely by means of a high pass filter (HPF) 114 for eliminating signals outside the RF frequency range, so that unwanted components are removed before transmittal.

In the transmit device 100 of FIG. 1, the electrical connection FB also comprises a filters for eliminating signals outside the RF frequency range from the output signal, which is conveniently formed by the filter HPF 114 of the RF section. The connection FB may further comprise a phase shifter (not shown) for invoking one of a plurality of predetermined phase shifts to the second input signal. The phase shifter may conveniently be a resistor-capacitor/capacitor-resistor (RC/CR) block, as will appear from the following. Of course the connection FB may comprise further components, but it is preferred to keep their number as low as possible, since each component may introduce further non-idealities.

The device of FIG. 2 is an analog receiver device 200, which also has analog conversion circuitry 202, but for converting an received RF signal to a baseband signal. The analog conversion circuitry 202 may comprise one or more conversion steps, each formed by a local oscillator (LO) 206 and a mixer 208. The additional components of the device of FIG. 2 with respect to a known analog receiver device 200 are shown in dotted lines.

An RF section, which during normal operation receives RF signals, is connected on the input of the analog conversion circuitry 202. A baseband section 204, which is connected to the output of the analog conversion circuitry 202, is also provided for supplying a baseband input signal to the input of the analog conversion circuitry 202 for calibration purposes. This is shown in FIG. 2 by means of the arrow connecting the baseband section 204 to the input (the RF side) of the analog conversion circuitry 202.

At least a portion of the output signal of the analog conversion circuitry 202 is added onto the baseband input signal by means of signal adding means, which are formed by an electrical connection FB in FIG. 2, but other means may also be provided for this purpose. Again, this has the effect that an RF second input signal is supplied to the input of the analog conversion circuitry 202 and added to the first baseband input signal. The second input signal is downconverted back to a baseband output signal, which is the result of an upconversion and a downconversion by the same analog conversion circuitry 202. So by extracting and measuring the baseband output signal and comparing it with the baseband input signal supplied from the baseband section 204, characteristics of the analog conversion circuitry 202 can be determined.

In the analog receiver device 200 of FIG. 2, the baseband output signal is extracted from the output signal by means of a low pass filter (LPF) 210 or alternative means, which eliminates the RF components from the output of the analog conversion circuitry 202. The baseband output signal is then supplied to a characterization block 212, which is provided for deriving the desired device characteristics and supplying signal correction data to the baseband section 204.

In the analog receiver device 200 of FIG. 2, the baseband section 204 is also connected to the output of the analog conversion circuitry 202 via the low pass filter (LPF) 210, which is thus conveniently used during calibration as well as during normal operation of the analog receiver device 200. During calibration, a switch can, for example, disconnect the baseband section 204.

The electrical connection FB may further comprise a phase shifter (not shown) for invoking one of a plurality of predetermined phase shifts to the second input signal. The phase shifter may conveniently be an RC/CR block. Of course the connection FB may comprise further components, but it is preferred to keep their number as low as possible, since each component may introduce further non-idealities.

In the following, the invention is applied to the example of a direct upconversion (or zero-IF) analog transmitter, which is used in many modern integrated transceiver systems. It is understood that the invention can more generally be applied in any electrical device which has analog frequency conversion circuitry.

In the following, the signal adding means, i.e., the connection line or alternative means that adds the portion of the output signal of the analog conversion circuitry to the input signal, is referred to as feedback circuitry. This terminology is relevant, since the output is (partly) "fed back" to the input, but it should be noted that such terminology is generally used to refer to circuitry which actually measure the output and apply a correction to the source, much like the characterization blocks 112, 212 in FIGS. 1 and 2.

Figure 3:
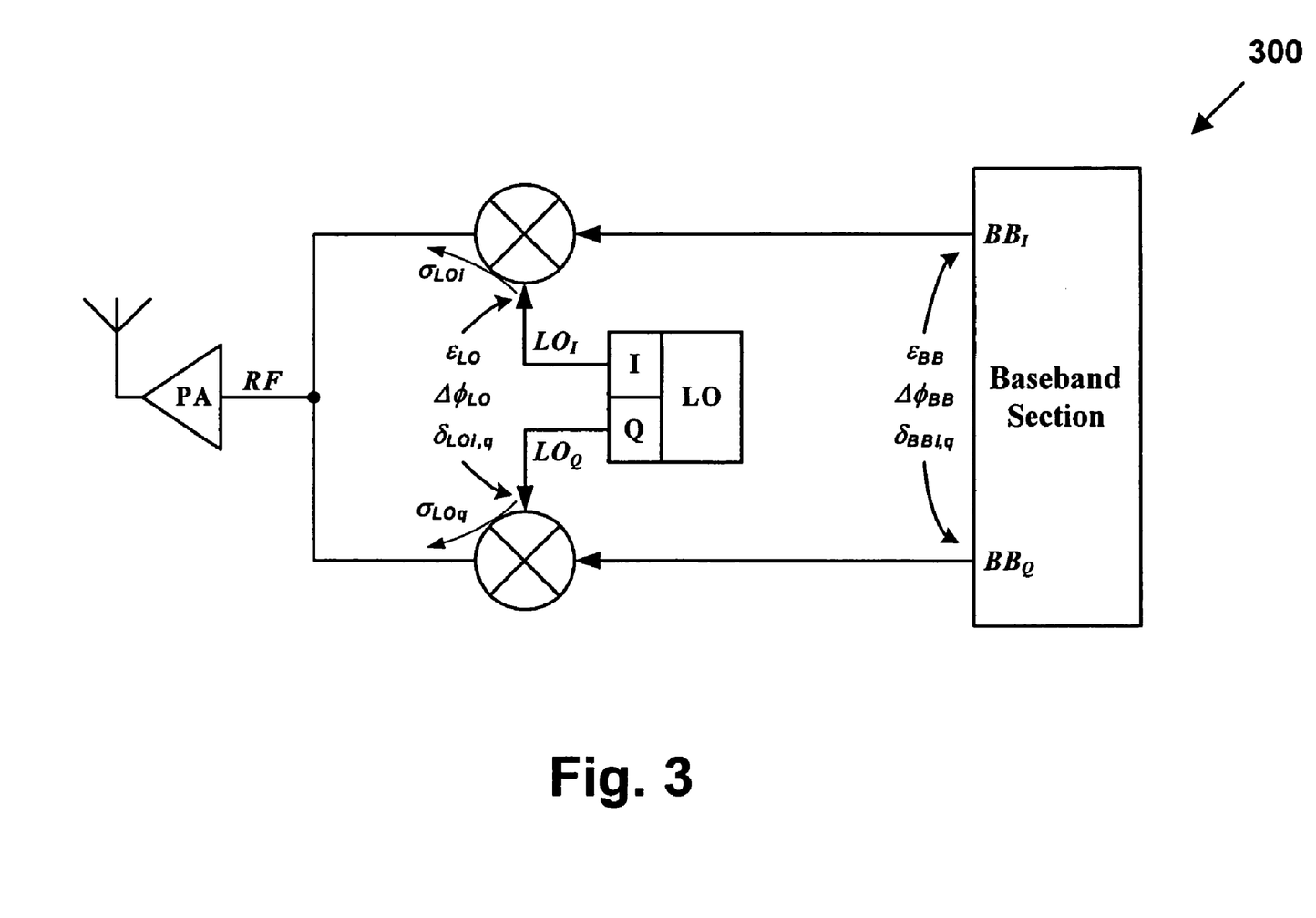
FIG. 3 shows a direct upconversion transmitter architecture.
Figure 4:
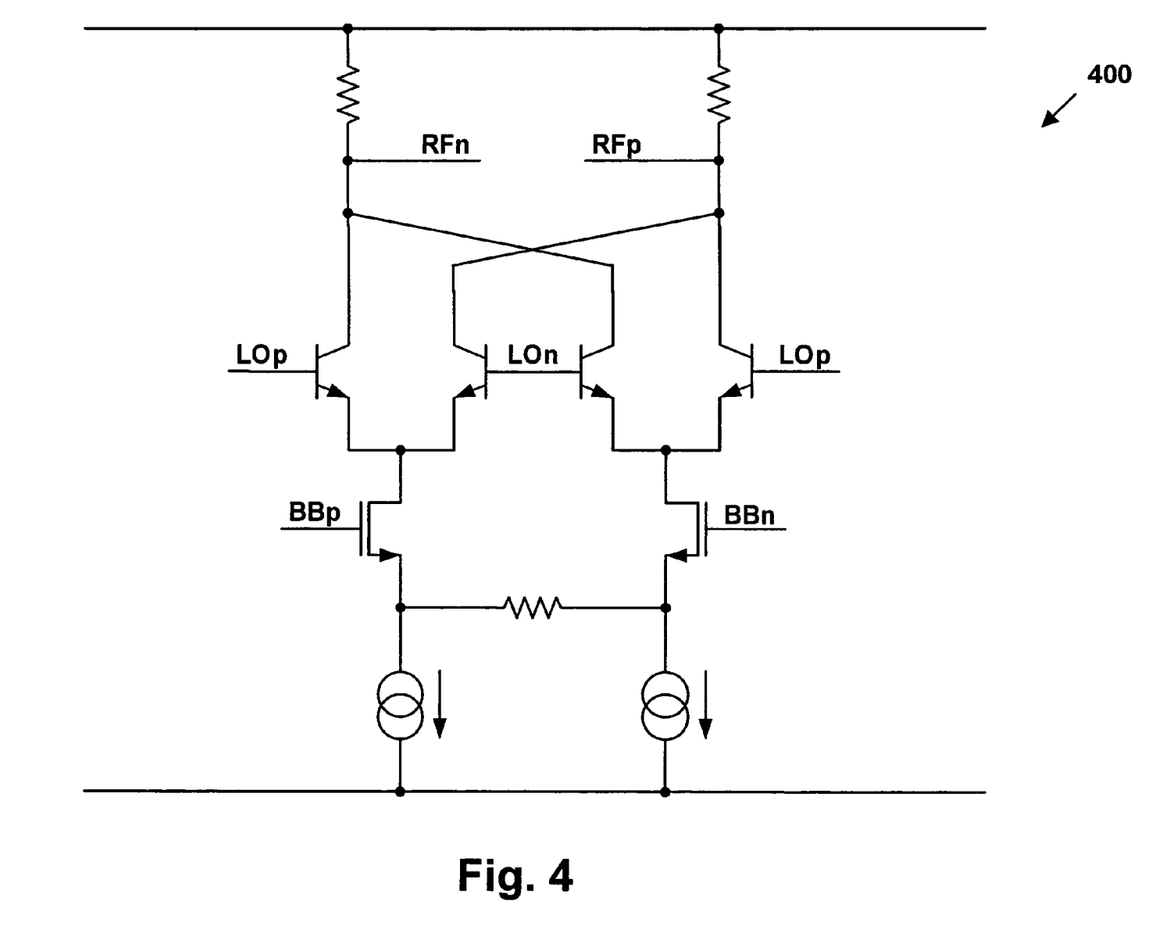
FIG. 4 shows a standard circuit diagram for an upconversion mixer.
Figure 5:
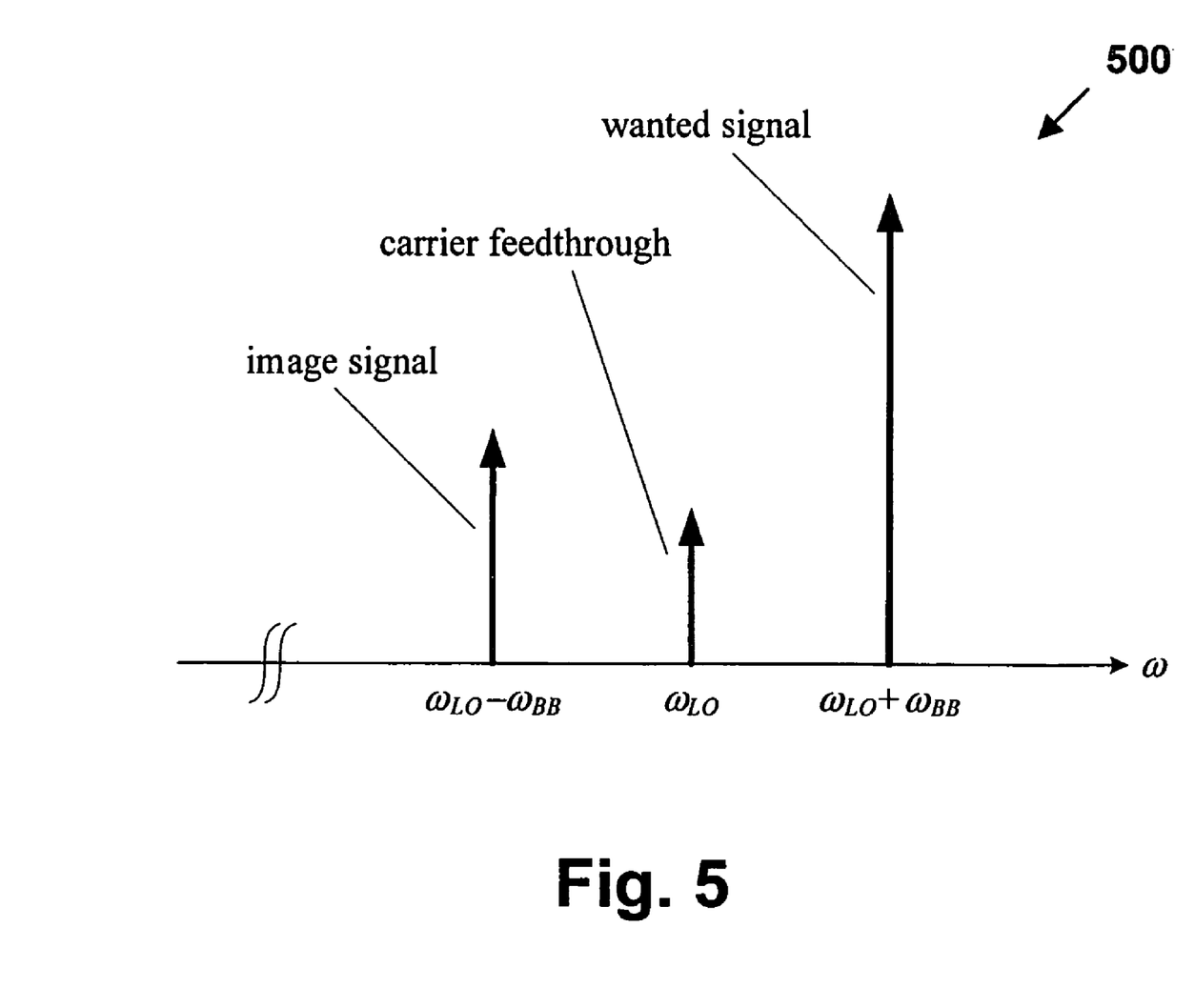
FIG. 5 shows the typical output spectrum of a direct upconversion mixer.

A known direct upconversion transmitter 300 is shown in FIG. 3. A standard circuit diagram for the mixer block 400 is shown in FIG. 4. A typical output spectrum 500 of a direct upconversion mixer is shown in FIG. 5. The two mixers are driven by baseband (BB) and local oscillator (LO) signals that are in quadrature. If all circuits are perfectly matched, the RF output signal is given by $$RF = LO_I \cdot BB_I - LO_Q \cdot BB_Q \quad (1)$$

$$= \cos(\omega_{LO} \cdot t) \cdot \cos(\omega_{BB} \cdot t) - \sin(\omega_{LO} \cdot t) \cdot \sin(\omega_{BB} \cdot t)$$

$$= \cos((\omega_{LO} + \omega_{BB}) \cdot t)$$

The two signals add constructively for the wanted sideband and destructively for the unwanted sideband, which results in the desired single sine wave at frequency $\omega_{LO} + \omega_{BB}$.

Although this architecture is generally suited for this purpose, the architecture has the drawback over heterodyne upconverters of generating some in-band spurs that cannot be eliminated by appropriate RF filtering. The most important spurs are located on the image frequency (due to imperfect image rejection) and on the carrier frequency (due to DC offsets and LO-to-RF feedthrough). The two quadrature paths (I and Q) are not perfectly matched, and real implementations of this circuit will have mismatches in amplitude ($\epsilon$) and phase ($\Delta\phi$) and DC offsets ($\delta$). The complex baseband signal of amplitude $A_{BB}$, frequency $\omega_{BB}$ and phase $\theta_{BB}$ can be described with the following equations:

$$V_{BBi} = A_{BB} \cdot (1+\epsilon_{BB}) \cdot \cos(\omega_{BB} \cdot t + \theta_{BB} + \Delta\phi_{BB}) + \delta_{BBi}$$

$$V_{BBq} = A_{BB} \cdot (1-\epsilon_{BB}) \cdot \sin(\omega_{BB} \cdot t + \theta_{BB} - \Delta\phi_{BB}) + \delta_{BBq} \quad (2)$$

The baseband signal is upconverted to RF by the quadrature LO signals $$V_{LOi} = A_{LO} \cdot (1+\epsilon_{LO}) \cdot \cos(\omega_{LO} \cdot t + \theta_{LO} + \Delta\phi_{LO}) + \delta_{LOi}$$

$$V_{LOq} = A_{LO} \cdot (1-\epsilon_{LO}) \cdot \sin(\omega_{LO} \cdot t + \theta_{LO} - \Delta\phi_{LO}) + \delta_{LOq} \quad (3)$$

Errors in amplitude and phase result in the generation of an image component at frequency $\omega_{LO} - \omega_{BB}$ with a magnitude in dBc given by:

$$P_{image} = 20 \cdot \log(\tan(\Delta\phi)) \quad (4)$$

$$= 20 \cdot \log(\varepsilon)$$

So an amplitude error of 2% generates in image component of −34 dBc, and the image rejection with a phase error of 3° is 25 dB. So in order to be able to comply with the transmitter requirements of high-data rate communication systems, such as an orthogonal frequency division multiplexing (OFDM) WLAN, a calibration scheme is required. DC offsets in the baseband signal generate a carrier component that must also be limited to comply with the spectral mask specifications. Again, a DC offset of 2% results in a carrier component of −34 dBc. But more importantly this carrier feedthrough is also created by direct LO-to-RF feedthrough in the mixers, as indicated with the contributions $\sigma_{LOi}$ and $\sigma_{LOq}$ depicted in FIG. 3.

Figure 6:
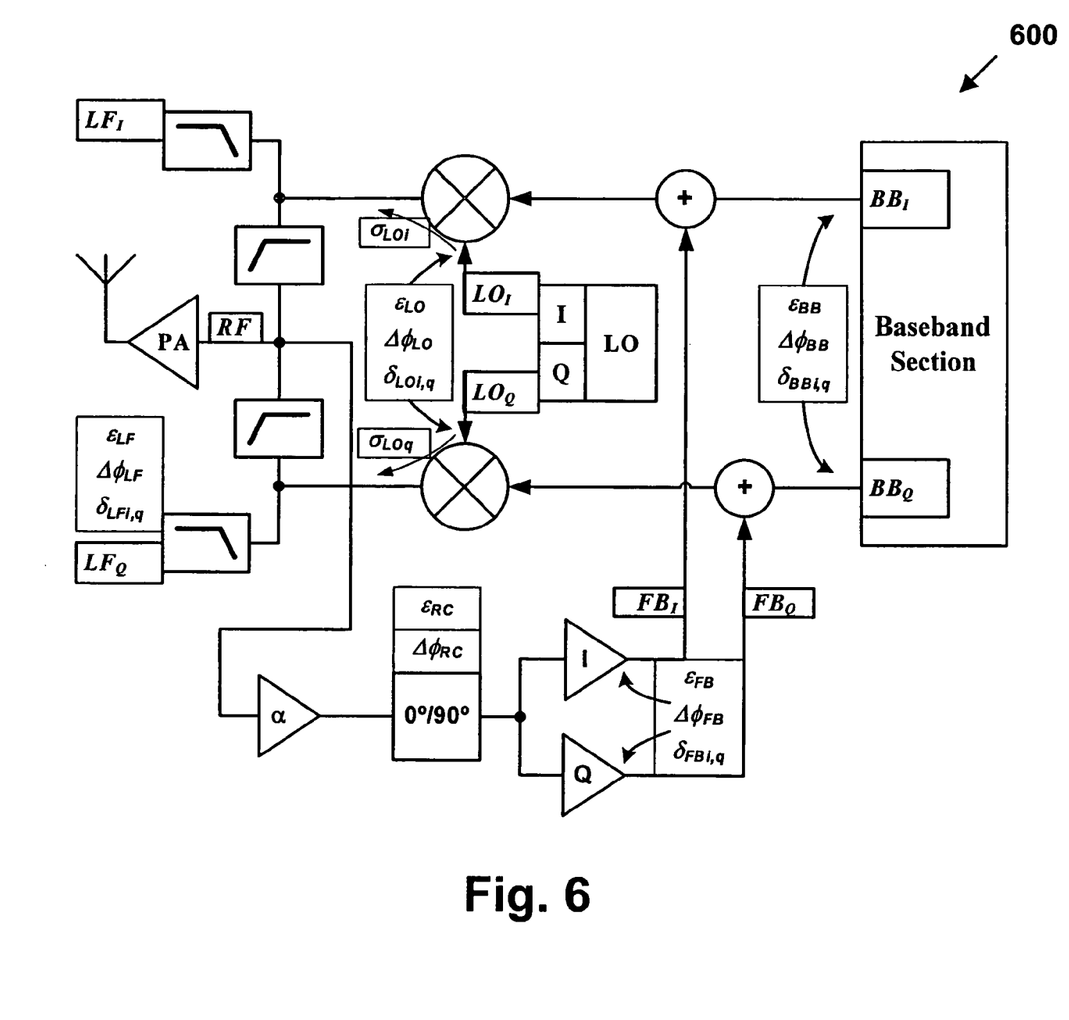
FIG. 6 shows an embodiment of a direct upconversion transmitter architecture according to the invention.

In applying the invention to the direct upconversion transmit architecture, as proposed in FIG. 6, the basic idea is to downconvert the RF signal back to baseband, but doing this by re-using the transmit mixers for the downconversion function. Again, errors may be made in this downconversion, but this time the errors in the up- and downconversion are correlated, so the required measurements and equations to calculate them can be derived. For example, the quadrature error in the downconversion will be the same as in the upconversion, so the actual error will be half of the quadrature error which is measured on the downconverted signal.

Figure 7:
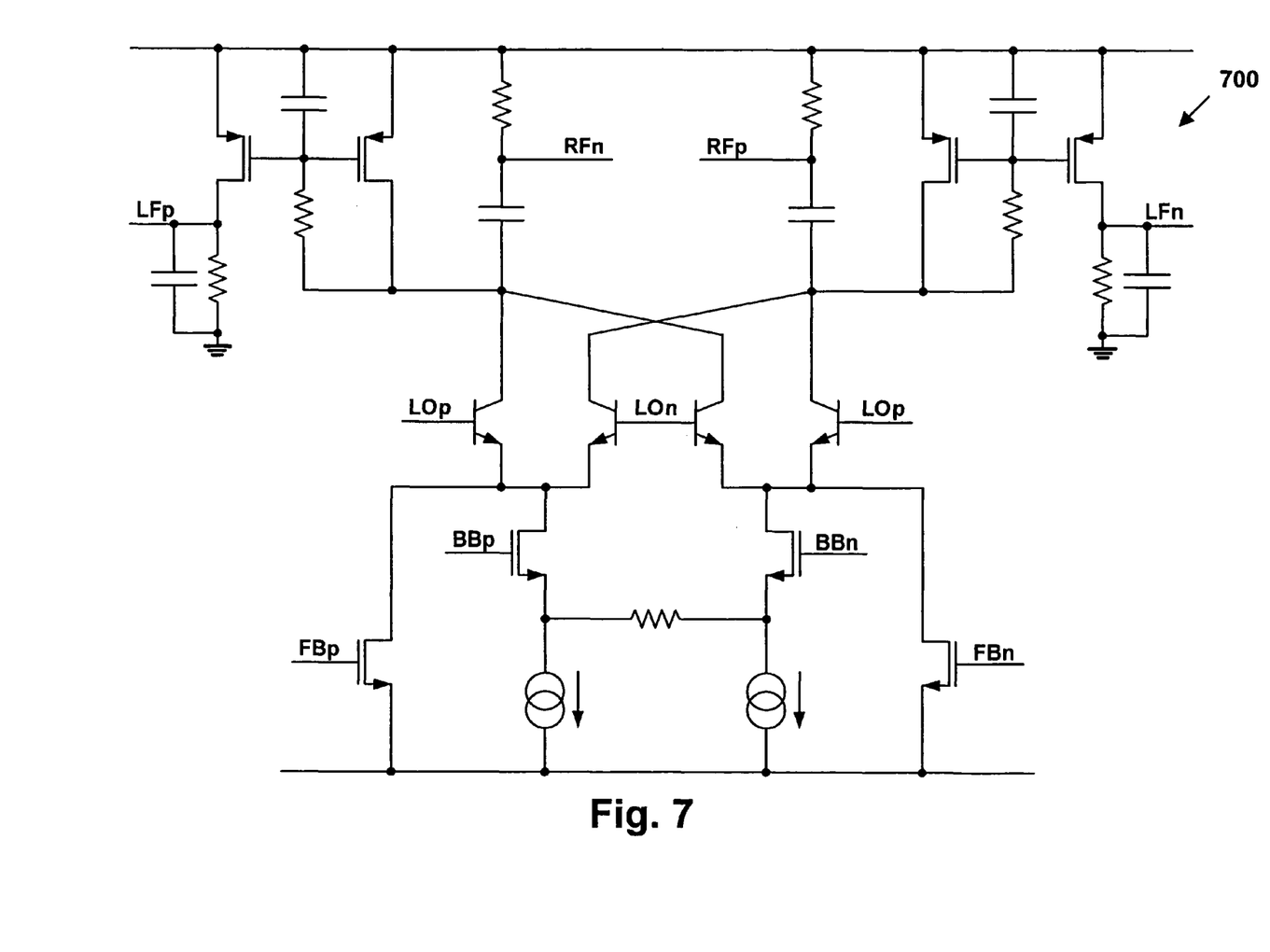
FIG. 7 shows a possible circuit implementation of an upconversion mixer according to the invention.

Thorough investigation of this idea shows that, although at first sight very simple, retrieving transmit (TX) errors requires some more operations than this. The main reason is that there are a lot of unknown and uncertain phase shifts in the RF path, which complicate the mathematical formulas. The circuit topology 700 that allows to successfully recover all errors is shown in FIG. 7. By comparison with the standard circuit topology 400 of FIG. 4, the additional components are immediately clear. The standard upconversion operation passes the LO×BB signal through a high-pass filter to the RF port. In the circuit 700 of FIG. 7, a fraction α of the RF signals is tapped and fed back to the BB input ports of the TX mixers. This will create an RF×LO=BB component in the output spectrum, which passes through a low-pass filter and is measured at the LF ports. This signal can be amplified and converted to the digital domain (e.g., by a receive video graphics array (VGA) and an analog-to-digital converter (ADC) already present in the system), where the necessary calculations required for determining the quadrature errors can be performed.

An RC phase shifter generating the FB signal with either 0 or 90 degrees delay is inserted for obtaining two output signals which make it possible to perform all the mathematical operations for retrieving two LO quadrature errors $\epsilon_{LO}$ and $\Delta\phi_{LO}$. All the added blocks are also not perfectly matched and they have quadrature errors associated with them as indicated in the FIG. 6. A possible circuit implementation of a mixer including the low- and high-pass filtering in the output path and the extra feedback inputs in parallel with the baseband inputs is shown in FIG. 7.

Of course, all the extra circuitry is not free from nonidealities, and will introduce errors in the calibration measurements which are performed. These errors are also indicated in FIG. 6. They include:

quadrature errors ($\epsilon_{FB}$ and $\Delta\phi_{FB}$) and DC offsets ($\delta_{FBi}$ and $\delta_{FBq}$) in the feedback signals $FB_I$ and $FB_Q$ quadrature errors ($\epsilon_{LF}$ and $\Delta\phi_{LF}$) and DC offsets ($\delta_{LFi}$ and $\delta_{LFq}$) in the low-frequency signals $LF_I$ and $LF_Q$ amplitude and phase errors ($\epsilon_{RC}$ and $\Delta\phi_{RC}$) in the 90-degree rotation in the feedback path.

In the following calibration procedure, sufficient measurements and mathematics are employed to cancel out the effect of these extra imperfections, and acquire a good estimation for the errors in the baseband and local oscillator signals.

Below it is described how the feedback circuitry can be used to automatically calibrate the transmit spectrum, at regular times before actually transmitting data. Several measurements are performed, making regular use of switches or multiplexers that guide low-frequency signals from one part of the circuit to another. Care must be taken to design these multiplexers such that they do not influence the measurement. Preferably, multiplexing is done in the current domain and simple complementary metal oxide semiconductor (CMOS) pass transistors can be used to switch the signal from one node to another. The calculations presented make use of the Fast Fourier Transform (FFT) function, a block that comes for free in an OFDM modem since the receiver is not running at this moment. For other applications where such an FFT is not readily available, other mathematic derivations can be analogously developed.

The complete calibration sequence is performed in 6 steps, as set out below.

Step 1: Calibrate the BB Signal

Figure 8:
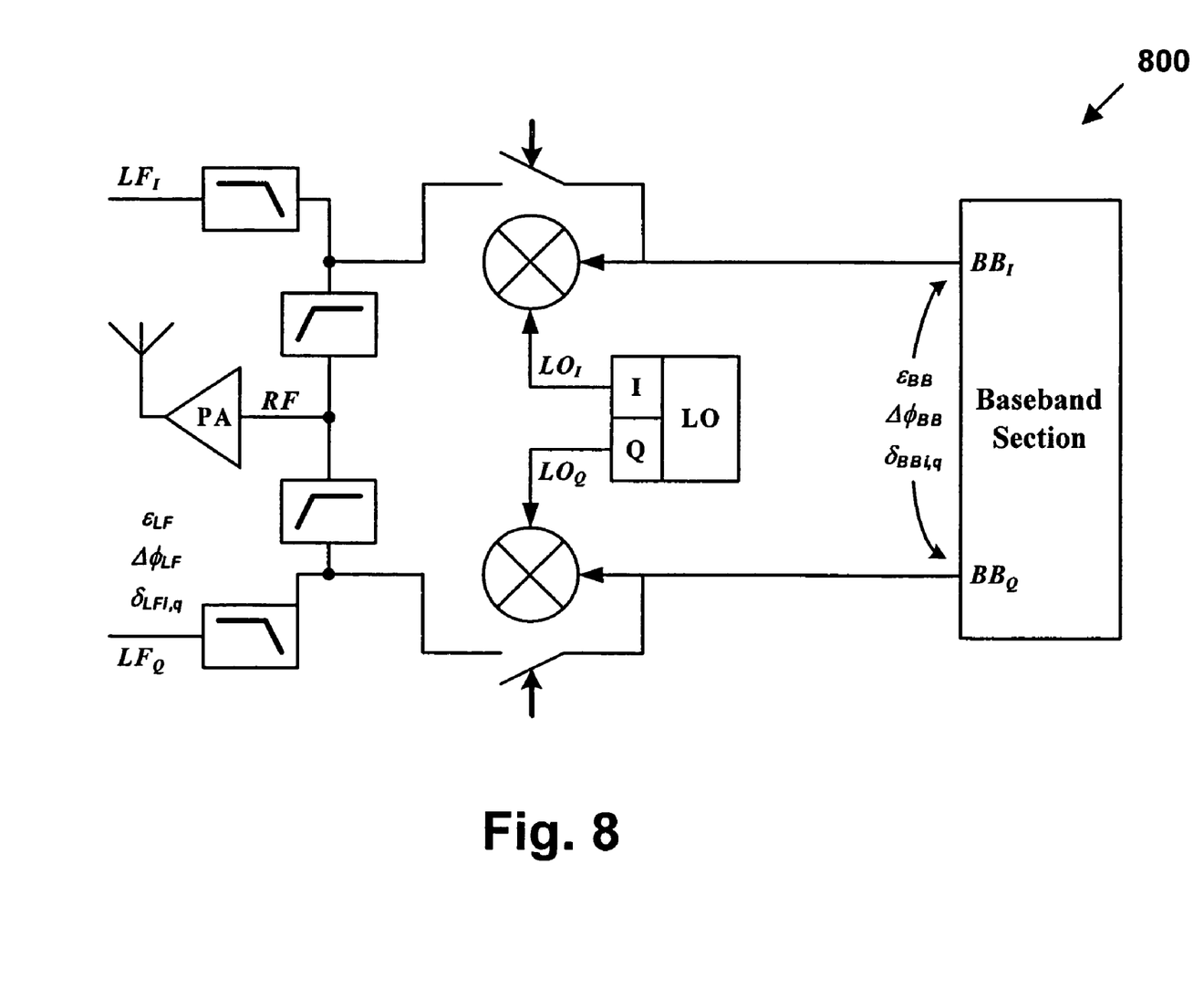
FIG. 8 shows a block diagram for baseband calibration of the device of FIG. 6.
Figure 10:
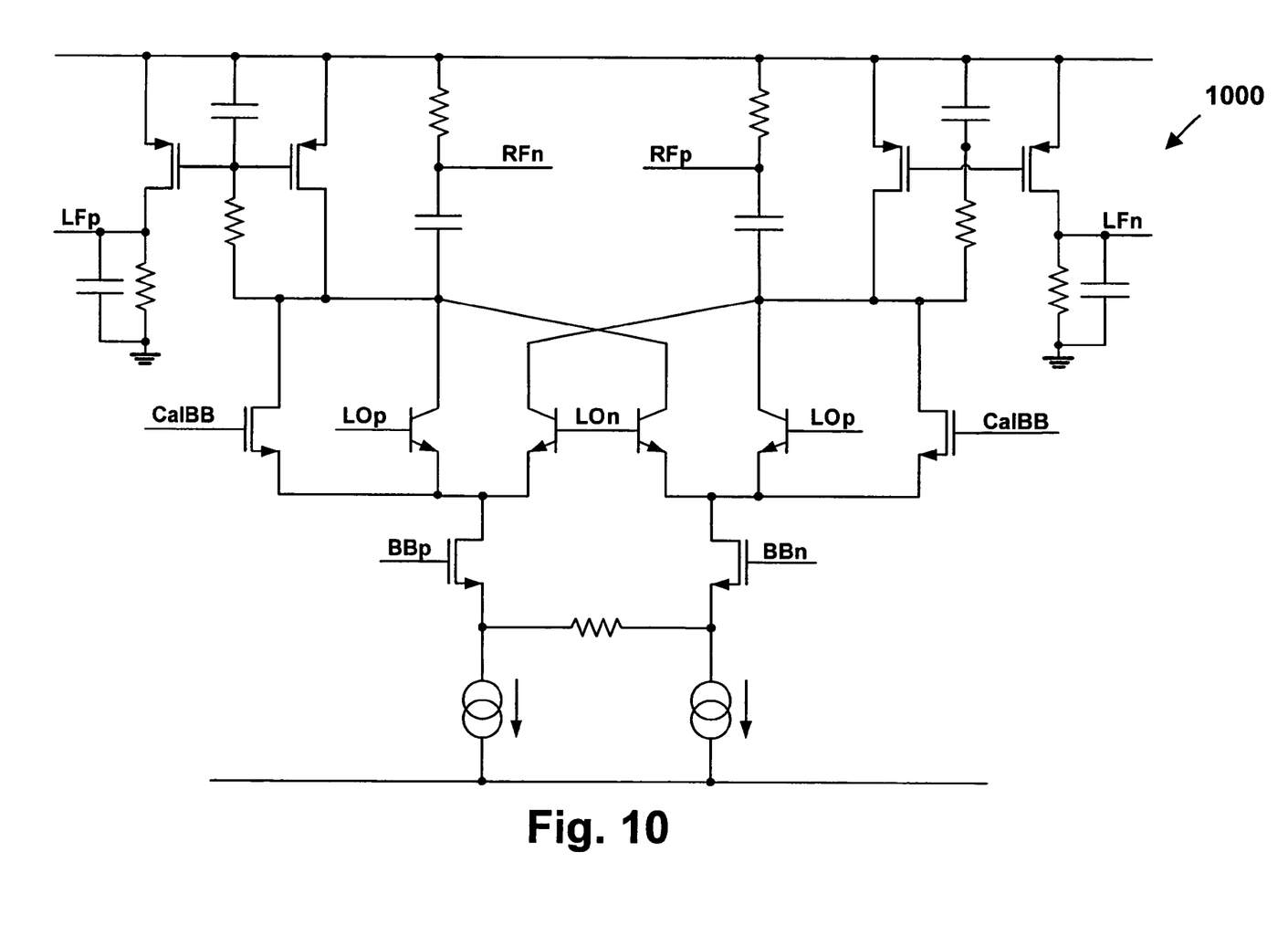
FIG. 10 shows a possible circuit implementation for baseband calibration of the upconversion mixer of FIG. 7.

In this step a sine wave BB signal is applied to the mixer, but the circuit is put in a configuration where it does not perform an upconversion. Instead the baseband signal is transferred directly to the output, where it takes the path through the low-pass filter and is detected at the low frequency (LF) outputs. A block diagram 800 for this is shown in FIG. 8 and a possible circuit implementation 1000 for this is shown in FIG. 10. The LO signal can be running, but the DC level of the LO mixer transistors is set to ground to towards the LF outputs. An alternative would be to apply no LO signal, and shift only the DC level of the inner mixer transistors (driven by the signal LOn) to zero, while the outer transistors stay active and conduct the BB current without any mixing operation to the output.

In order to cancel the quadrature error of the LF path ($\epsilon_{LF}$ and $\Delta\phi_{LF}$) (both in the filter circuitry shown and in the following amplifiers and analog-to-digital converters), two measurements are taken with I and Q signals swapped:

$BB_I$ signal to $LF1_I$ signal and $BB_Q$ current to $LF1_Q$ signal $BB_I$ signal to $LF2_Q$ signal and $BB_Q$ current to $LF2_I$ signal.

And in order to cancel the DC offsets in the LF path ($\delta_{FBi}$ and $\delta_{FBq}$) a third measurement is taken with the sign of the BB signals swapped:

$-BB_I$ signal to $LF3_I$ signal and $-BB_Q$ current to $LF3_Q$ signal.

Since all these switches (only one pair CalBB is shown in FIGS. 8 and 10) are done in the current domain, the influence of imperfect matching in the switches should be negligible.

To determine the BB quadrature errors, the first two measurements can be combined:

$$LF_I = LF1_I + LF2_Q$$

$$LF_Q = LF1_Q + LF2_I \quad (5)$$

and the FFT of the complex signal $LF_I + j \cdot LF_Q$ is taken that will contain three spectral components:

one at frequency $+\omega_{BB}$ with a complex amplitude A+j·B one at frequency $-\omega_{BB}$ with a complex amplitude C+j·D one at DC with a complex amplitude E+j·F.

The DC component does not contain any useful information since the DC offsets off the LF path are still included. From the other numbers the quadrature errors of the BB signal can be calculated with these equations:

$$\varepsilon_{BB} = \frac{C \cdot A - D \cdot B}{A^2 + B^2} \quad (6)$$

$$\Delta\phi_{BB} = -\frac{C \cdot B + D \cdot A}{A^2 + B^2}$$

It is also possible to apply a multi-tone BB signal and in this way determine the frequency-dependent BB quadrature errors. These will be rather important because mismatch in the anti-alias filter after the digital-to-analog converter will shift the position of the filter poles, and so generate a different amplitude and phase response in the I and Q path.

In the extreme case for the WLAN OFDM system, a BB signal with 26 carriers at all positive frequencies n×312.5 kHz can be applied, and for each component the resulting signal at the negative frequency (given by the FFT component C+j·D) gives the quadrature error information. Care must be taken however that harmonic distortion components from carrier x do not disturb the measurements at carriers 2x, 3x, etc. Therefore, it is preferred that only a limited number of BB carriers are applied, whose frequencies are chosen such that the harmonic distortion components do not fall on top of other fundamental frequencies. The quadrature errors of the other (non-used) carriers can easily be retrieved from interpolation between the known points. Also the phases of the applied carriers may be chosen so that the generation of signals with high crest factors is avoided.

Next the baseband DC offsets are determined by combining the first and the third measurements:

$$LF_I = LF1_I - LF3_I$$
$$LF_Q = LF1_Q - LF3_Q \quad (7)$$

and taking the average (DC) value of them gives
average of $LF_I = G$
average of $LF_Q = H$
from which the baseband DC offsets can be calculated:

$$\delta_{BBi} = \frac{G}{\sqrt{A^2 + B^2}} \quad (8)$$
$$\delta_{BBq} = -\frac{H}{\sqrt{A^2 + B^2}}$$

As there normally is a programmable gain implemented in the transmit baseband circuitry to provide a certain amount of RF power control, it is possible that DC offset and/or quadrature errors might be dependent on the TX baseband gain. In that case, step 1 might have to be repeated for the different possible gain settings, or a subset thereof.

Step 2: FB DC Offset Calibration

Next the DC offset in the feedback path is measured. This is done because later we will activate them to feedback the RF signal to the LF ports, and the DC signal present at the LF ports will be used as an estimation of the carrier spectrum of the RF output. If however this feedback path inserts also DC offset, a false carrier component will be generated and the actual LO feedthrough will be incorrectly compensated for.

Figure 11:
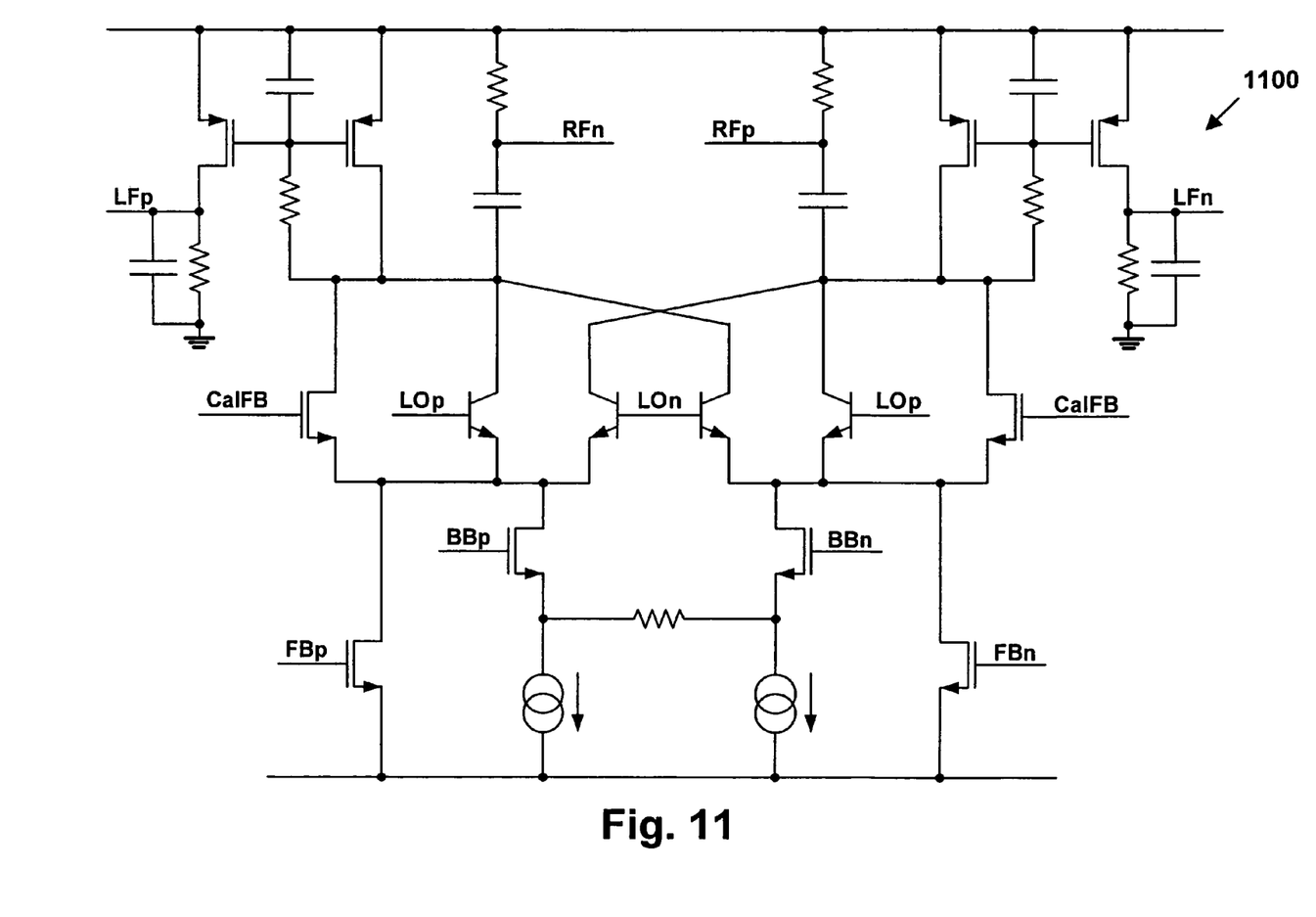
FIG. 11 shows a possible circuit implementation for feedback DC offset calibration of the upconversion mixer of FIG. 7.

For this, the feedback circuitry is activated, but no RF signal is applied to it. The digital TX block, taking into account the previously estimated DC offset, must generate a zero baseband signal. As for the baseband calibration, the LO transistors of the mixer are biased at ground level and are short-circuited by a switch leading the FB signal directly towards the LF ports. A possible circuit 1100 is shown in FIG. 11.

In order to cancel the DC offsets in the LF path ($\delta_{FBi}$ and $\delta_{FBq}$), two measurements are taken with the sign of the FB signals swapped:
$FB_I$ signal to $LF1_I$ signal and $FB_Q$ current to $LF1_Q$ signal
$-FB_I$ signal to $LF1_I$ signal and $-FB_Q$ current to $LF2_Q$ signal
and taking the average (DC) value of the difference between these two measurements gives
average of $LF1_I - LF2_I = G$
average of $LF1_Q - LF2_Q = H$
from which the feedback DC offsets can be calculated:

$$\delta_{FBi} = \frac{G}{\sqrt{A^2 + B^2}} \quad (9)$$
$$\delta_{FBq} = -\frac{H}{\sqrt{A^2 + B^2}}$$

Figure 12:
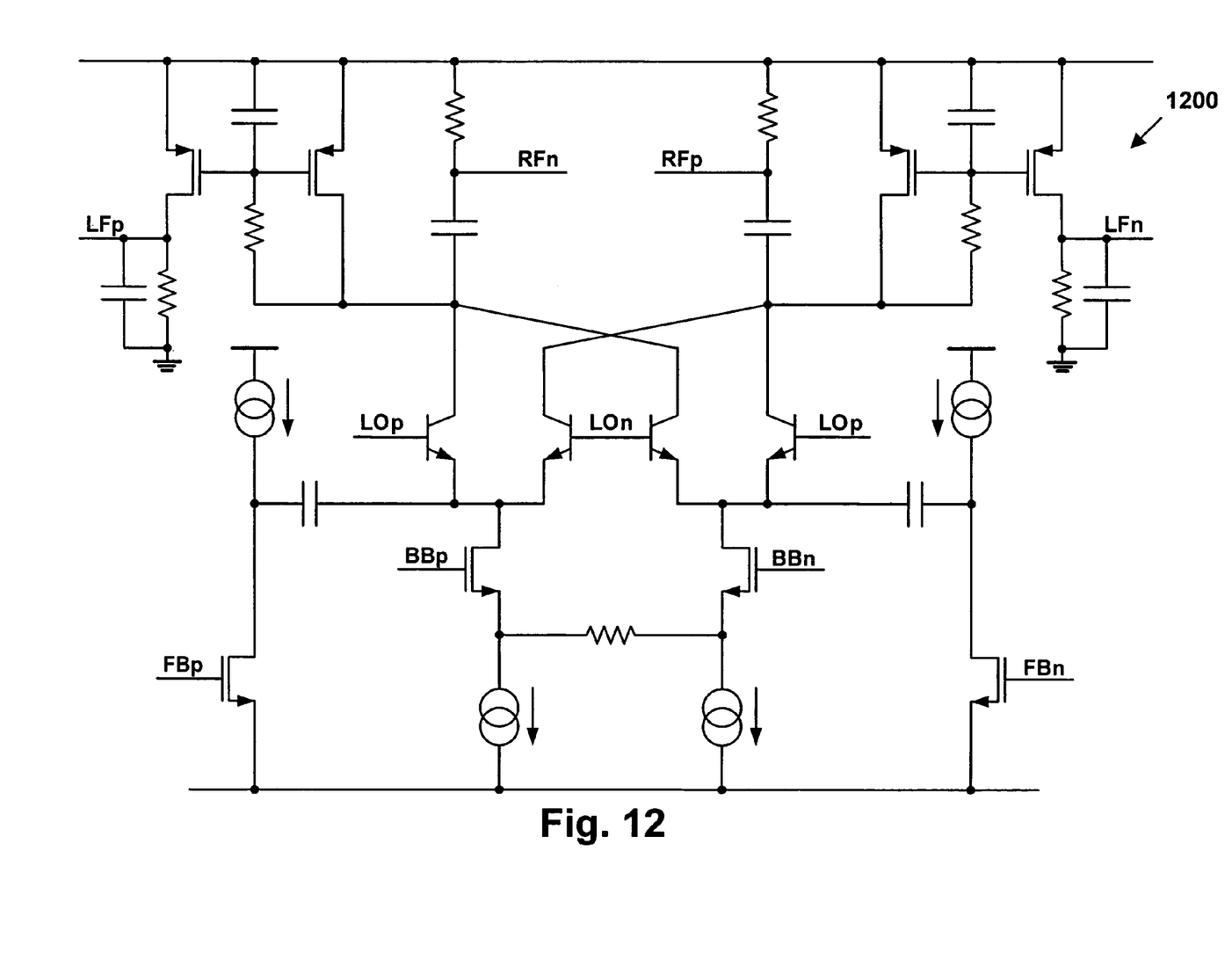
FIG. 12 shows a possible circuit implementation for AC-coupling the feedback inputs of the upconversion mixer of FIG. 7.

Alternatively (and even preferably) a feedback circuit can be built that does not generate any DC offset, for example, by simple AC coupling (or high-pass filtering) the feedback connection to the mixer input. An example circuit 1200 for a Gilbert-cell upconversion mixer is shown in FIG. 12. In this case it is not needed to calibrate out the feedback DC offset, saving the two measurements in step 2. And even more, the third measurement of step 1 can be omitted because in the next step the LO-to-RF feedthrough is estimated. If there is a baseband DC offset, it will be combined with the LO-to-RF feedthrough and be compensated for in the same way. Of course, the baseband DC offset can be dependent on the baseband gain setting, so one must be careful in choosing the set of measurements to do.

Step 3: Calibrate Local Oscillator DC Offset

Because DC offsets in the LO signal pass a fraction of the baseband signal directly to the mixer output, an error may be introduced in the measurements in steps 4 and 5. This error is measured now in order to cancel its contribution later.

For this, a single BB tone is applied, preferably one having a low frequency. It should have no quadrature errors or DC offsets, so the results of step 1 should already be applied now. It should also be generated with zero phase, i.e., the delay through the BB path, the LF measurement, and the FFT calculation should be compensated for. This can easily be done by calculating the phase of the BB signal in step 1 ($\theta_{BB} = \arctan(B/A)$) and applying this value.

For the baseband DC offset, as explained before, one is free to compensate the offset at this point or do a combined estimation in this step of BB DC offsets ($\delta_{BBi,q}$) and LO-to-RF feedthrough ($\sigma_{LOi,q}$) in steps 4, 5 and 6.

The mixer now operates normally and shifts this baseband signal towards RF frequencies, but also generates some low-frequency signals. Two measurements are performed to cancel out quadrature errors in the LF path:
output of mixer I to $LF1_I$ signal and output of mixer Q to $LF1_Q$ signal
output of mixer I to $LF2_Q$ signal and output of mixer Q to $LF2_I$ signal.

These waveforms contain information on the DC offsets in the LF path and the LO path. One could calculate these numbers based on the FFT results. A more efficient method captures these waveforms over a time interval of one period and stores the waveforms for later use.

Step 4: First RF Measurement

The same BB signal as in step 3 is applied. The mixer now operates normally and shifts this baseband signal towards RF frequencies. But now the feedback path FB is also activated with the 0-degree delay setting, which causes the circuit to generate a low-frequency component that will be measured at the LF outputs. The delay setting at 0° is just a relative number, there are other phase shifts in the RF section which are unknown now but which will be canceled out by the final mathematic formulas.

Again two measurements are done to cancel out the quadrature errors of the LF path:
output of mixer I to $LF1_I$ signal and output of mixer Q to $LF1_Q$ signal
output of mixer I to $LF2_Q$ signal and output of mixer Q to $LF2_I$ signal.

The waveforms obtained in step 3 are subtracted from those obtained here in step 4. This effectively eliminates the errors due to DC offsets in the LF and the LO signals.

To estimate the LO quadrature errors and LO-to-RF feedthrough components, the FFT of the complex signal $(LF1_I + LF2_Q) + j \cdot (LF1_Q + LF2_I)$ is taken, which contains three spectral components:
one at frequency $+\omega_{BB}$ with a complex amplitude $A1 + j \cdot B1$
one at frequency $-\omega_{BB}$ with a complex amplitude $C1 + j \cdot D1$
one at DC with a complex amplitude $E1 + j \cdot F1$.

It turns out that there are still too many unknowns in the system and not enough equations to solve them. Therefore a second RF measurement is needed.

Step 5: Second RF Measurement

This step is a copy of step 4, but now the feedback delay is set to 90 degrees. This phase shifter does not have to be a very good one, because if the phase difference is not exactly 90° or if the amplitude does not remain equal, this can be detected in the LF signal and the final mathematics used in step 6 to estimate the errors will take this into account. So, a single RC/CR phase shifter is sufficient for this purpose.

Again, two measurements (to cancel LF quadrature errors), subtraction of the waveforms of step 3 (to cancel LF and LO DC offsets), and the FFT of the average of the two obtained signals will result in three spectral components:
one at frequency $+\omega_{BB}$ with a complex amplitude $A2+j \cdot B2$
one at frequency $-\omega_{BB}$ with a complex amplitude $C2+j \cdot D2$
one at DC with a complex amplitude $E2+j \cdot F2$.

Step 6: Mathematical Calculations

The following formulas are able to give a good approximation of the LO quadrature errors:

$$\varepsilon_{LO} = \frac{(D2 \cdot B1 - D1 \cdot B2) + (C2 \cdot A1 - C1 \cdot A2)}{2 \cdot (A2 \cdot B1 - A1 \cdot B2)} \quad (10)$$

$$\Delta\phi_{LO} = \frac{(C2 \cdot B1 - C1 \cdot B2) - (D2 \cdot A1 - D1 \cdot A2)}{2 \cdot (A2 \cdot B1 - A1 \cdot B2)}$$

The carrier feedthrough amplitude and phase are given by the equations:

$$\sigma_{LOi} = \frac{E2 \cdot B1 - E1 \cdot B2}{A2 \cdot B1 - A1 \cdot B2} \quad (11)$$

$$\sigma_{LOq} = \frac{F2 \cdot B1 - F1 \cdot B2}{A2 \cdot B1 - A1 \cdot B2}$$

A compensated RF output spectrum is obtained by digitally precompensating the baseband signal with the estimations as follows:

$$BB_{corr,i} = (1-\epsilon_{BB}-\epsilon_{LO}) \cdot \cos(\omega_{BB} \cdot t - \Delta\phi_{BB} - \Delta\phi_{LO}) - (\delta_{BBi} + \sigma_{LOi})$$

$$BB_{corr,q} = (1+\epsilon_{BB}+\epsilon_{LO}) \cdot \sin(\omega_{BB} \cdot t + \Delta\phi_{BB} + \Delta\phi_{LO}) - (\delta_{BBq} + \sigma_{LOq}) \quad (12)$$

As these formulas include a phase shift, this correction is preferably done in the frequency domain, e.g., prior to the Inverse Fast Fourier Transform (IFFT) of the OFDM modulation.

Figure 9:
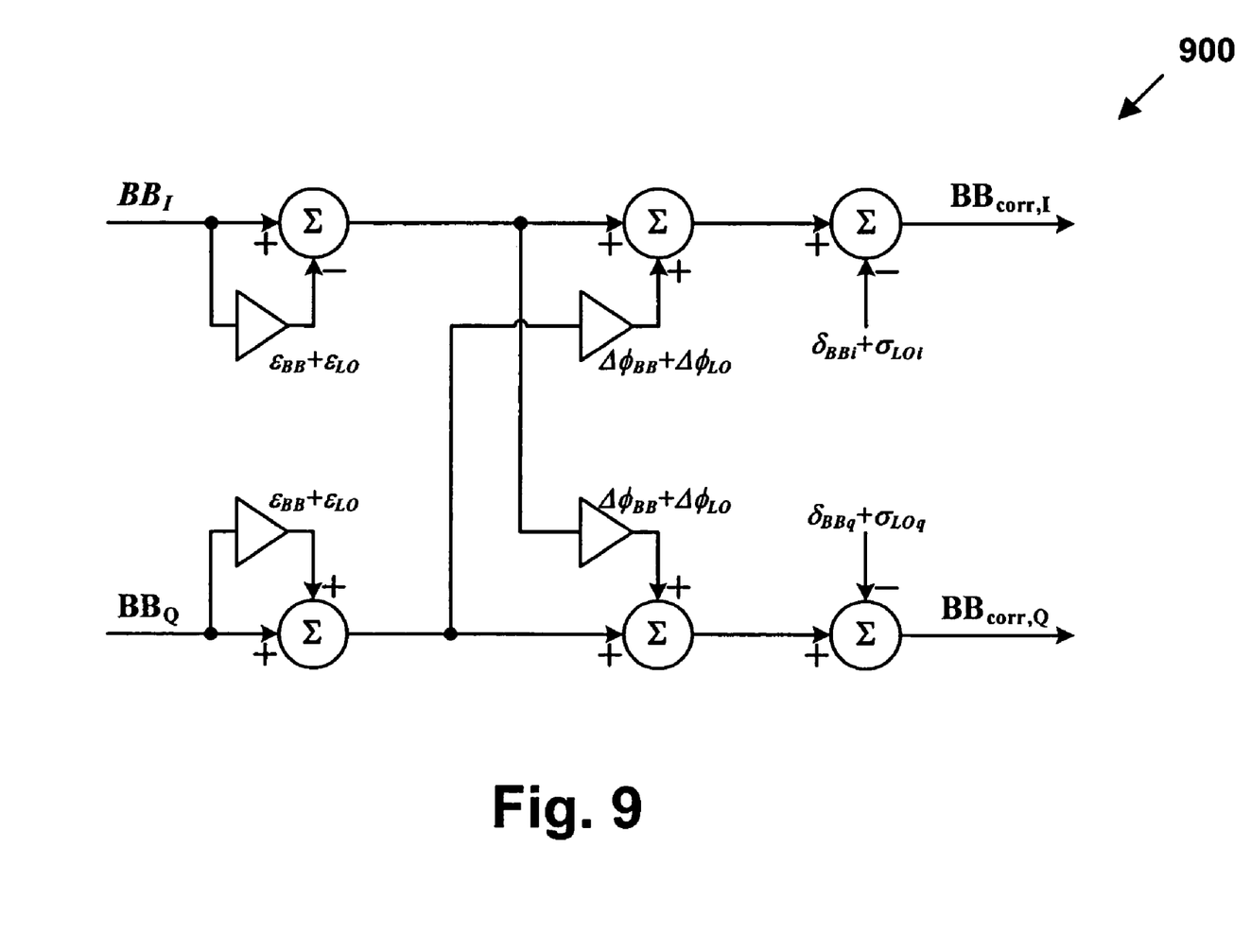
FIG. 9 shows a block diagram for time-domain baseband precompensation of the device of FIG. 6.

A correction in the time domain is also possible, provided that the baseband quadrature errors are not (or minimally) frequency-dependent. The following equations apply:

$$BB_{corr,i} = (1-\epsilon_{BB}-\epsilon_{LO}) \cdot BB_I + (\Delta\phi_{BB}+\Delta\phi_{LO}) \cdot BB_Q - (\delta_{BBi} + \sigma_{LOi})$$

$$BB_{corr,q} = (1+\epsilon_{BB}+\epsilon_{LO}) \cdot BB_Q + (\Delta\phi_{BB}+\Delta\phi_{LO}) \cdot BB_I - (\delta_{BBq}+\sigma_{LOq}) \quad (13)$$

and a block diagram 900 for this implementation is shown in FIG. 9.

These formulas are linear approximations with respect to all other errors in the circuit. However, these formulas are:
second-order dependent on $\epsilon_{BB}$ and $\Delta\phi_{BB}$,
third-order dependent on $\epsilon_{LF}$ and $\Delta\phi_{LF}$,
second-order dependent on $\epsilon_{FB}$ and $\Delta\phi_{FB}$, and
third-order dependent on $\epsilon_{RC}$ and $\Delta\phi_{RC}$,
which makes them an improvement of around 20 dB in image rejection.

Note that, although perfectly valid with ideal mixer circuits, simulations with real-life implementations show a small systematic deviation from these results. For example, the BB phase θBB seems to be not perfectly the same as the compensation needed in the measurements on step 2 and 3. However, this is something that can be easily detected during simulations and the algorithm can be adjusted for it.

This technique might be expanded further to compensate other transmit non-idealities, the most important of which are non-linearities. If the RF feedback signal is taken not directly at the mixer output, but at the power amplifier (PA) output just before the antenna, sufficient information should be present to detect and correct the nonlinear behavior of the PA.

In conclusion, the invention provides a method for measuring and correcting the RF output spectrum of a direct upconversion mixer. Amplitude and phase information of all the spectral components of the output signal is obtained by downconverting the RF signal back to baseband. However, unknown errors in the downconversion operation are avoided by re-using the transmit mixer as a downconverter. An automatic calibration procedure is presented that explains all the measurements and calculations to be performed in order to obtain an accurate estimate of both the image rejection and the carrier feedthrough. This procedure could even be extended to include other analog non-idealities, such as intermodulation distortion.

This automatic calibration procedure can be generally described as a method for calibrating a direct upconversion transmitter, which comprises one or more of the following calibration steps:

applying a sine wave baseband signal to both the I and Q branch as input signal and transferring it directly without upconversion to the output of the analog conversion circuitry and conducting a first measurement with the characteristic deriving means; swapping the input signals of the I and Q branch and conducting a second measurement with the characteristic deriving means; and deriving quadrature errors of the baseband signal from the first and second measurements;

applying a zero baseband signal to both the I and Q branch, short circuiting the analog conversion circuitry and conducting a third measurement with the characteristic deriving means; swapping the sign of the second input signal and conducting a fourth measurement with the characteristic deriving means; and deriving a DC offset of the signal adding means from the third and fourth measurements;

applying a single baseband tone to both the I and Q branch while the analog conversion circuitry is operational and the signal adding means are not operational and conducting a fifth measurement with the characteristic deriving means; swapping the output signals of the I and Q branches and conducting a sixth measurement with the characteristic deriving means; and deriving a DC offset of the analog conversion circuitry from the fifth and sixth measurements;

applying a single baseband tone to both the I and Q branch while the analog conversion circuitry and the signal adding means are operational with a first phase shift on the second input signal, and conducting a seventh measurement with the characteristic deriving means; swapping the output signals of the I and Q branches and conducting an eighth measurement with the characteristic deriving means; applying a second phase shift to the second input signal and conducting a ninth measurement with the characteristic deriving means; swapping the output signals of the I and Q branches and conducting a tenth measurement with the characteristic deriving means; and deriving conversion circuitry quadrature errors and/or carrier feedthrough amplitude and/or carrier feedthrough phase from the seventh to tenth measurements.

It should be understood that the illustrated embodiments are exemplary only and should not be taken as limiting the scope of the present invention. The claims should not be read as limited to the described order or element unless stated to that effect. Therefore, all embodiments that come within the scope and spirit of the following claims and equivalents thereto are claimed as the invention.

The invention claimed is:

1. A method comprising:
supplying a first input signal to an electrical device, the electrical device having analog conversion circuitry which is configured for performing a frequency conversion on a first input signal within a first frequency range to obtain an output signal within a second frequency range different from the first frequency range;
feedback circuitry adding at least a portion of the output signal as a second input signal to the first input signal;
deriving at least one characteristic of the electrical device from the frequency converted second input signal;
applying a predetermined phase shift to the second input signal before it is added to the first input signal; and
deriving at least one characteristic of the electrical device from the frequency converted phase shifted second input signal.

2. The method of claim 1, wherein the at least one characteristic is determined from a first frequency range portion which is extracted from the output signal.

3. The method of claim 2, further comprising eliminating signals outside a second frequency range from the output signal for creating the first frequency range portion of the output signal.

4. The method of claim 1, further comprising precompensating the input signal on the basis of the at least one derived characteristic.

5. The method of claim 4, wherein precompensating the input signal is performed in the digital domain.

6. The method of claim 1, further comprising:
a first circuit electrically connected to the input of the analog conversion circuitry supplying the first input signal;
a second circuit electrically connected to the output of the analog conversion circuitry transmitting the output signal, and
a characterization block connected to the output of the analog conversion circuitry supplying signal correction data to the first circuit.

7. A method comprising:
supplying a first input signal to an electrical device, the electrical device having analog conversion circuitry which is configured for performing a frequency conversion on a first input signal within a first frequency range to obtain an output signal within a second frequency range different from the first frequency range;
feedback circuitry adding at least a portion of the output signal as a second input signal to the first input signal;
deriving at least one characteristic of the electrical device from the frequency converted second input signal;
wherein the electrical device is provided for I/O modulation and comprises an I branch and a Q branch, the first input signal being supplied to the I branch and a third input signal being supplied to the Q branch, the third input signal having a phase which is substantially orthogonal to the first input signal, the output signal is formed by a combination of the I branch output and the Q branch output of the analog conversion circuitry, the method further comprising splitting a first frequency range portion of the output signal into the second input signal and a fourth input signal which is added to the third input signal.

8. A method comprising:
supplying a first input signal to an electrical device, the electrical device having analog conversion circuitry which is configured for performing a frequency conversion on a first input signal within a first frequency range to obtain an output signal within a second frequency range different from the first frequency range;
feedback circuitry adding at least a portion of the output signal as a second input signal to the first input signal;
deriving at least one characteristic of the electrical device from the frequency converted second input signal;
wherein the at least one characteristic of the electrical device is selected from the group consisting of DC offset, carrier feedthrough, quadrature imperfection, and intermodulation distortion.

* * * * *